(12) United States Patent
Dietz et al.

(10) Patent No.: US 7,130,175 B2
(45) Date of Patent: Oct. 31, 2006

(54) MONOLITHIC INTEGRATABLE CIRCUIT ARRANGEMENT FOR PROTECTION AGAINST A TRANSIENT VOLTAGE

(75) Inventors: Franz Dietz, Heilbronn (DE); Lars Hehn, Heilbronn (DE); Manfred Klaussner, Heilbronn (DE); Anton Koch, Elztal-Auerbach (DE)

(73) Assignee: ATMEL Germany GmbH, Heilbronn (DE)

( * ) Notice: Subject to any disclaimer, the term of this patent is extended or adjusted under 35 U.S.C. 154(b) by 212 days.

(21) Appl. No.: 10/900,643

(22) Filed: Jul. 27, 2004

(65) Prior Publication Data
US 2005/0024801 A1    Feb. 3, 2005

(30) Foreign Application Priority Data
Jul. 28, 2003    (DE) ................. 103 35 383

(51) Int. Cl.
*H02H 3/22* (2006.01)
(52) U.S. Cl. ..................................... 361/111
(58) Field of Classification Search ................. 361/90, 361/111, 91.1
See application file for complete search history.

(56) References Cited

U.S. PATENT DOCUMENTS

| | | | |
|---|---|---|---|
| 4,254,442 A * | 3/1981 | Dijkmans et al. ............. 361/56 |
| 5,448,180 A | 9/1995 | Kienzler et al. ............... 326/15 |
| 5,633,515 A | 5/1997 | Gantolier et al. ........... 257/140 |
| 5,886,381 A | 3/1999 | Frisina ........................ 257/320 |
| 5,986,862 A | 11/1999 | Kim ............................. 361/56 |
| 6,075,276 A * | 6/2000 | Kitamura .................... 257/481 |
| 6,570,226 B1 * | 5/2003 | Groeseneken et al. ...... 257/361 |
| 6,628,490 B1 | 9/2003 | Muth ........................ 361/91.1 |
| 6,894,542 B1 * | 5/2005 | Prexl et al. .................... 327/67 |

FOREIGN PATENT DOCUMENTS

| | | |
|---|---|---|
| DE | 4407279 | 10/1994 |
| DE | 69527146 | 12/2002 |
| EP | 1178531 A1 | 2/2002 |

* cited by examiner

*Primary Examiner*—Brian Sircus
*Assistant Examiner*—Terrence Willoughby
(74) *Attorney, Agent, or Firm*—W. F. Fasse; W. G. Fasse

(57) ABSTRACT

At least one or more terminals of an integrated circuit, such as a low- or high-side driver stage, are protected against transient or over-voltages by two pairs of diodes. A first pair of diodes includes a regular diode (D1 or D1') and a Zener-diode (ZD1 or ZD1'). A second pair of diodes also includes a regular diode (D2 or D3) and a Zener-diode (ZD2 or ZD3). These diode pairs are looped into the respective circuit and cooperate with an n-channel MOSFET or a p-channel MOSFET to provide the required over-voltage protection, particularly for transmitter/receiver circuits and databus systems especially in motor vehicles.

13 Claims, 2 Drawing Sheets

MONOLITHIC INTEGRATABLE CIRCUIT ARRANGEMENT FOR PROTECTION AGAINST A TRANSIENT VOLTAGE

PRIORITY CLAIM

This application is based on and claims the priority under 35 U.S.C. §119 of German Patent Application 103 35 383.6, filed on Jul. 28, 2003, the entire disclosure of which is incorporated herein by reference.

FIELD OF THE INVENTION

The invention relates to a monolithic integratable circuit arrangement for protecting an integrated circuit, more specifically the circuit terminals of an integrated circuit, against transient voltages also referred to as excess voltages or over-voltages.

BACKGROUND INFORMATION

The term "monolithic" as used herein refers to a single piece integrated circuit or module. In connection with the use and operation of integrated circuits attention must be paid to protecting the circuit arrangement, more specifically the terminals of the circuit or its connection pins or connector tabs against excess or transient voltages. Such voltages can interfere with the normal operation of the circuit and may even damage the integrated circuit components. Transient voltages can be generated, for example by the capacitive and/or inductive coupling between conductors that are arranged in common on the circuit board. It has been noted that, for example in connection with so-called CAN-bus systems, positive as well as negative transient voltages may occur with amplitudes of up to ±45V. Such bus conductors are installed in motor vehicles in the form of a cable harness. The transient voltage is measured relative to the substrate or relative to the reference voltage of the integrated circuit which represents the lowest potential of the integrated circuit. Another source for transient voltages are so-called electrostatic discharges (ESD) which can generate low energy, yet high amplitude voltage peaks.

Conventional circuit arrangements for the protection against transient voltages of integrated circuit limit these transient voltages which are positive relative to a reference voltage, to an adjustable limit value. When a transient voltage at a terminal or contact pin is generated and exceeds the adjustable limit value, circuit elements become conductive for thus limiting the voltage occurring at the particular terminal. This type of excess voltage limitation is also known as a so-called clamp voltage arrangement or simply clamp mechanism.

Normally, the circuit arrangements or circuit components for the protection against excess voltages are monolithically integrated into the integrated circuit to be protected because discrete or external not integrated circuit components make the design of the integrated circuits more difficult and do not assure a respective safety in operation.

In case voltages that are negative relative to a substrate reference voltage or potential, occur at a terminal, it is possible that parasitic diodes such as box diodes, bulk diodes or substrate diodes become conductive, whereby an interference with the proper operation may occur or the integrated circuit may be damaged. Such negative transient voltages are conventionally clamped to a level which is lower than the substrate reference potential. This lower voltage level corresponds to the diode conducting voltage of a protective diode that functions as a voltage limiting element. Stated differently, the protective diode becomes conductive when the voltage present at the respective terminal in its absolute value exceeds the diode conducting voltage. Thus, the voltage limits at which a clamping mechanism becomes effective are different for positive and negative excess or transient voltages in conventional protective circuit arrangements.

The voltage limit differences can lead to problems, particularly in a differential data transmission. Two data conductors are required in a differential data transmission, whereby the voltage difference between two data conductors are used for encoding the character or signal to be transmitted. Each of two data conductors is respectively connected to a corresponding terminal of a driver circuit stage, whereby the two terminals form a terminal pair. If a logic "1" is being transmitted, the same potential is present at both terminals. If a logic "0" is transmitted, one of the terminals assumes a high potential in the range of a supply voltage and the other terminal assumes a low potential in the range of the reference voltage or potential. This type of data transmission is substantially non-sensitive relative to common mode interferences on both conductors provided the terminals of the driver stage permit the presence of positive and negative voltage amplitudes without distorting these positive and negative voltage amplitudes, particularly by a clamp mechanism.

OBJECTS OF THE INVENTION

In view of the foregoing it is the aim of the invention to achieve the following objects singly or in combination:
  to provide a monolithic integratable or integrated protection circuit arrangement for the protection against transient voltages whereby the circuit protects an integrated circuit against positive and/or negative excess voltages that may occur at the terminals of the integrated circuit;
  to avoid distortions of the useful signals by clamping mechanisms; and
  to assure that the transient voltage protection circuit can be produced without any special circuit components in an economic manner.

The invention further aims to avoid or overcome the disadvantages of the prior art, and to achieve additional advantages, as apparent from the present specification. The attainment of these objects is, however, not a required limitation of the present invention.

SUMMARY OF THE INVENTION

The above objects have been achieved according to the invention by the combination of the following features in a so-called low-side driver stage or in a so-called high-side driver stage for providing a transient voltage protection for one terminal or more terminals of such a driver stage or stages. A first Zener-diode and a first diode are provided for each of these terminals or at least for one of these terminals. The first Zener-diode and the first diode form a first pair of diodes which are looped or wired into the protection circuit between the respective terminal and the reference potential, whereby the first Zener-diode and the first diode are connected to potentials that normally make the first Zener-diode conductive while making the first diode non-conductive.

The first diode prevents that the first Zener-diode becomes conductive as long as positive voltages are present at the respective terminal also referred to as stage terminal. When negative voltages are present at the respective terminal, the first diode is conductive and the first Zener-diode is non-conductive. When the negative voltage at the respective terminal exceeds the Zener voltage of the first Zener-diode and thus also exceeds the voltage that makes the first diode conductive, a circuit path that is formed of the first Zener-diode and the first diode, becomes conductive and the voltage at the terminal is limited to the sum of the Zener voltage and the voltage that makes the first diode conductive. Particularly, the Zener-diode takes up the energy generated by negative electrostatic discharges, whereby a destruction of the protected circuit is prevented. By suitably selecting the Zener voltage, it becomes possible to adjust the voltage threshold up to the level where the clamp mechanism becomes effective.

In a first embodiment of the circuit arrangement according to the invention for a low-side driver stage, an n-channel MOSFET is allocated to each of one or more of the respective terminals or stage terminals to be protected. Furthermore, a second diode and a second Zener-diode forming a second diode pair are also looped into the circuit to be protected. The second diode is connected to be conductive between the respective terminal to be protected and a connector tab of the n-channel MOSFET. The second Zener-diode is connected to be normally non-conductive between the connector tab of the n-channel MOSFET and a reference potential.

The second diode prevents, in response to negative terminal voltages, a current flow through a bulk diode of the n-channel MOSFET. The bulk diode exists in the n-channel MOSFET between the drain terminal or tab and tab connected to the reference potential. The second Zener-diode serves for limiting a positive terminal voltage to a maximum value and thus serves particularly for taking up the energy of positive electrostatic discharge pulses, whereby a destruction of the circuit arrangement is prevented. When the positive terminal voltage exceeds the Zener voltage of the second Zener-diode and the conducting voltage of the second diode, a current path becomes conductive that is formed by the second diode and the second Zener-diode. At this point the voltage at the input terminal of the circuit is limited to the sum of the Zener voltage and the voltage that causes the second diode to be conductive. Again, by suitably selecting the Zener voltage it becomes possible to adjust the voltage threshold up to the level where the clamp mechanism becomes effective.

In a second embodiment of the circuit arrangement according to the invention for a high-side driver stage, a p-channel MOSFET is allocated to each of one or more of the terminals to be protected against transient voltages. Further, a second diode is connected to be normally conductive between the supply voltage and a connector tab of the p-channel MOSFET, and a second Zener-diode is connected to be normally non-conductive between the connector tab of the p-channel MOSFET and the reference potential.

The second diode prevents a current flow through a bulk diode of the p-channel MOSFET into the supply voltage when the terminal voltages are larger than the supply voltage. The p-channel MOSFET comprises such a bulk diode between its drain terminal or tab and its source terminal or tab. The second Zener-diode serves for limiting a positive terminal voltage to a maximum value and serves particularly for taking up the energy generated by positive electrostatic discharge pulses, whereby a destruction of the circuit arrangement is prevented. When the positive voltage at the terminal exceeds the Zener voltage of the second Zener-diode and the conducting voltage of the bulk diode, a conductor path formed by the second Zener-diode and the bulk diode becomes conductive and the voltage at the input terminal is limited to the sum of the Zener voltage and the diode conducting voltage. By suitably selecting the Zener voltage the voltage threshold can be adjusted up to the point where the clamping mechanism becomes effective.

According to a further embodiment of the invention, the respective Zener-diode has a breakdown voltage in the range of 30V to 50V and/or the respective diode has a breakdown voltage in the range of 50V to 60V. Such dimensioning of the Zener-diode and the diode makes possible a safe operation of the protected circuit arrangement through a wide voltage range which is well adapted to the typically occurring transient disturbance voltages.

The present circuit arrangement or rather transient voltage protection device is well suited for providing the required protection for a terminal of a low-side driver stage and/or a terminal of a high-side driver stage which together form a terminal pair for a differential signal transmission. The present circuit arrangements makes possible an effective protection against positive, as well as against negative transient over-voltages, whereby no clamp mechanism becomes effective for normal disturbance or over-voltage values. As a result, no signal falsification occurs. This feature of the invention makes possible a safe differential signal transmission even in environments that are subject to such disturbances, for example, in a motor vehicle.

The invention is also well suited for providing over-voltage protection in a transmitter receiver circuit for a bus system, particularly a so-called CAN-bus.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF THE PREFERRED EXAMPLE EMBODIMENTS AND OF THE BEST MODE OF THE INVENTION

Figure 1:
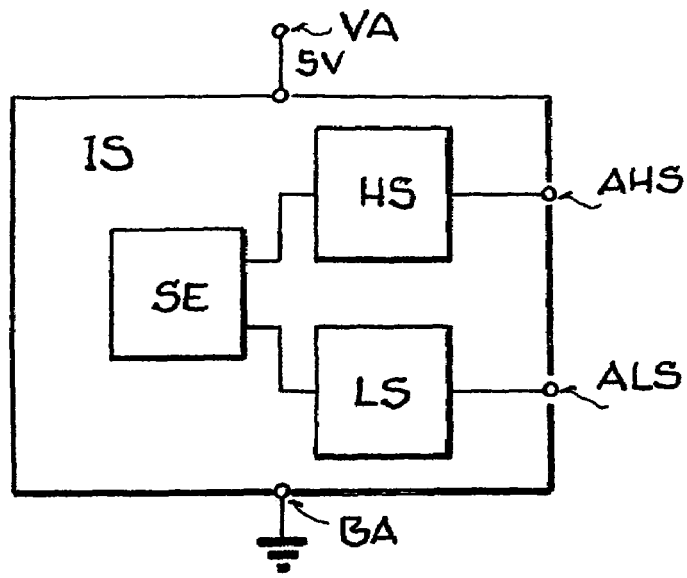
FIG. 1 shows a block circuit diagram of an integrated circuit for the differential data transmission with a high-side driver stage and a low-side driver stage, the terminals of which are respectively protected against over-voltages by circuit arrangements according to the invention.

FIG. 1 shows a circuit arrangement of an integrated circuit IS for a differential data transmission including a high-side driver stage HS and a low-side driver stage LS. The stage terminals AHS and ALS of the integrated circuit are respectively protected against over—or transient voltages by a circuit arrangement according to the invention. The driver stages LS and HS are respectively coupled with a transmitter receiver unit. This unit triggers the driver stages HS and LS and evaluates signals at the terminals AHS and ALS. A supply voltage of, for example, 5V is supplied to the integrated circuit IS through a supply voltage terminal VA. A reference voltage of, for example 0V is present at a reference potential terminal BA.

Figure 2:
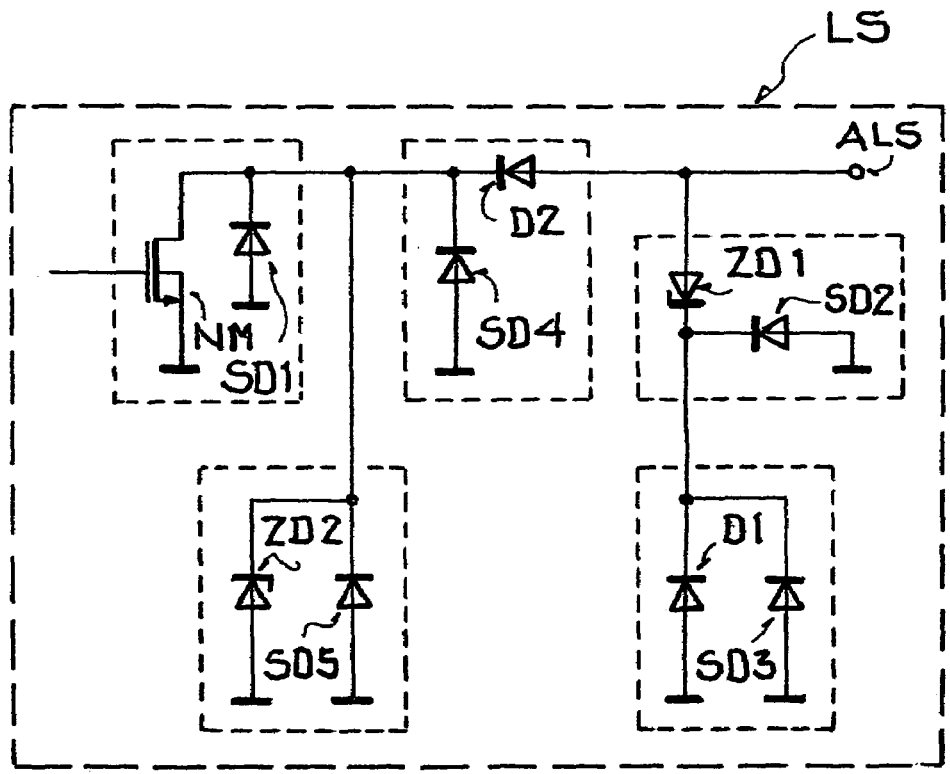
FIG. 2 is a circuit arrangement of the low-side driver stage according to FIG. 1, equipped with an over-voltage protection.

FIG. 2 shows a circuit diagram of the low-side driver stage LS of FIG. 1. The driver stage LS comprises a circuit component in the form of an n-channel MOSFET NM which connects the terminal ALS with the reference potential in response to a trigger signal generated by the transmitter receiver unit SE. The n-channel MOSFET NM comprises a substrate diode or rather a bulk diode SD1 between its drain connector tab and the reference potential.

A Zener-diode ZD1 and a diode D1 forming a pair are connected in series with each other and the series connection is looped or wired into the circuit between the terminal ALS and the reference potential. The Zener-diode ZD1 and the diode D1 are so wired or poled that the Zener-diode is normally, in the absence of a transient voltage, conducting while the diode D1 is normally non-conducting. The Zener-diode ZD1 and the diode D1 comprise a substrate diode SD2 or SD3 which are wired to be normally non-conducting between the reference potential and the respective cathode.

The diode D1 prevents switching the Zener-diode ZD1 to be conductive when positive transient voltages are present at the terminal ALS. When the transient voltages at the terminal ALS are negative, the diode D1 is conducting and the Zener-diode ZD1 is non-conducting. In case the negative voltage at the terminal ALS exceeds the Zener voltage of the Zener-diode ZD1 and the conducting voltage of the diode D1, a conducting path is formed by the Zener-diode ZD1 in series with the diode D1, whereby the voltage at the terminal ALS is limited to the sum of the Zener voltage and the diode conducting voltage. By suitably selecting the Zener voltage, it is possible to adjust the voltage threshold up to the level where the clamping mechanism becomes effective.

A diode D2 is looped into the circuit between the terminal ALS and the drain terminal of the n-channel MOSFET NM, whereby the diode D2 is normally conducting. This diode D2 prevents a current flow through the substrate diode SD1 of the n-channel MOSFET NM when negative transient terminal voltages are present. The diode D2 comprises a substrate diode SD4 between its cathode and the reference potential.

A second Zener-diode ZD2 which forms a pair with the diode D2 is looped into the circuit between the drain terminal tab of the n-channel MOSFET NM and the reference potential. Normally the second Zener-diode ZD2 is non-conductive and serves for limiting a positive transient terminal voltage to a maximum value. The Zener-diode ZD2 comprises a substrate diode SD5 between its cathode tab and the reference potential. When the positive terminal voltage at the terminal ALS exceeds the Zener voltage of the second Zener-diode ZD2 and the conducting voltage of the second diode D2, a current path formed by the Zener-diode ZD2 and the diode D2 becomes conductive and the voltage at the terminal ALS is limited to the sum of the Zener voltage and the diode conducting voltage. By suitably selecting the Zener voltage it becomes possible to adjust the threshold voltage to a level where a clamping mechanism becomes effective.

Figure 3:
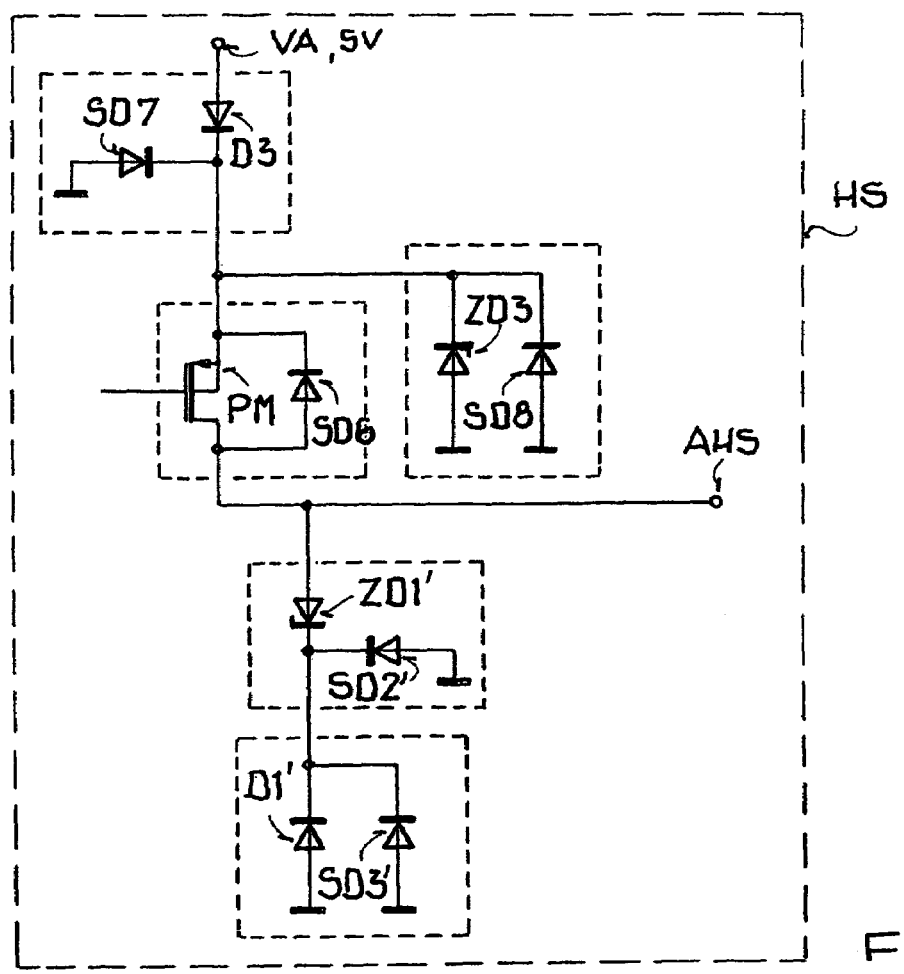
FIG. 3 is a circuit arrangement of the high-side driver stage of FIG. 1 equipped with an over-voltage protection.

FIG. 3 shows a circuit diagram of the high-side driver stage HS of FIG. 1. The driver stage HS comprises a circuit component in the form of a p-channel MOSFET PM which connects the stage terminal AHS with the supply voltage in response to a trigger signal from the transmitter receiver unit SE. The p-channel MOSFET PM comprises a substrate or rather a bulk diode SD6 between its drain terminal or tab and its source terminal or tab.

A diode D3 is looped into the circuit between the supply voltage and the drain tab of the p-channel MOSFET PM and poled to be conducting. The diode D3 comprises a substrate diode SD7 which is non-conductive between its cathode and the reference potential. The diode D3 prevents, in response to positive terminal voltages which are larger than the supply voltage, a current flow through the substrate diode SD6 of the p-channel MOSFET PM into the supply voltage terminal VA.

A Zener-diode ZD3 which is looped to be non-conductive between the drain terminal or tab of the p-channel MOSFET PM and the reference potential serves for limiting a positive transient terminal voltage to a maximum value. The Zener-diode ZD3 comprises a substrate diode SD8 between its cathode tab and the reference potential. When the positive voltage at the terminal AHS exceeds the Zener voltage of the Zener-diode ZD3 and the conducting voltage of the substrate diode SD6, a current path formed by the Zener-diode ZD3 and the substrate diode SD6 becomes conducting and the transient voltage at the input terminal is limited to the sum of the Zener-voltage and the diode conducting voltage. By suitably selecting the Zener voltage it becomes possible to adjust the voltage threshold to a level at which a clamping mechanism becomes effective.

A Zener-diode ZD1' and its corresponding substrate diode SD2' and a diode D1', as well as its corresponding substrate diode SD3' correspond in their circuit arrangement, in their function and in their dimensioning to the circuit components ZD1, ZD2, D1 and SD3 in FIG. 2.

Figure 4:
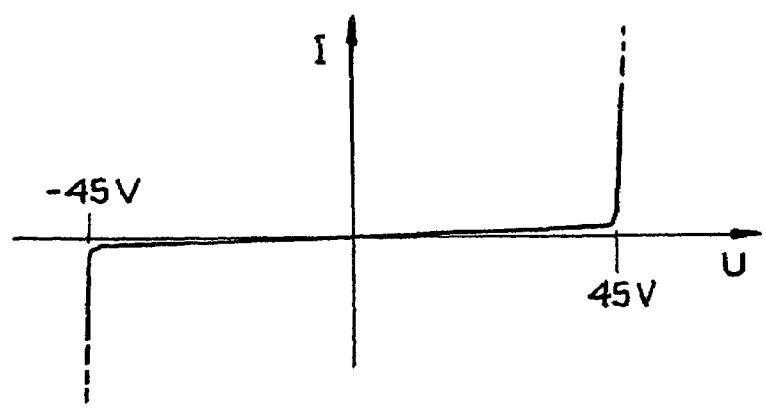
FIG. 4 shows a diagram of the current voltage characteristic curve between the terminals of the low-side and high-side driver stages of FIG. 1.

FIG. 4 shows a current characteristic curve as a function of the voltage between the stage terminal AHS and ALS in FIG. 1. As shown by the curve, the Zener-diodes are dimensioned in such a way that a clamp mechanism becomes effective only at signal amplitudes larger than ±45V. At smaller signal amplitudes the input signals are practically not falsified, whereby a certain signal recovery from the difference signal between the stage terminals AHS and ALS is assured.

The present invention makes it possible, as becomes clear from the above described example embodiment, an effective limiting of positive and negative transient voltages at the terminals of an integrated circuit. Falsifications of useful signals by a clamp mechanism occur only at very high transient voltages. The circuit arrangement can be manufactured in an economic way and it is easy to integrate into a monolithic circuit component because the present transient voltage protection circuit does not require any expensive special circuit components, such as poly-elements free of substrates, and it also does not require any expensive manufacturing technologies. The present invention is, for example suitable for CAN transceivers, as well as for any random other integrated transmitter receiver circuits for which a transient voltage protection is desired, whereby such protection can be achieved or realized without any external structural circuit components.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An integrated circuit arrangement comprising a low-side driver stage (LS) including at least one stage terminal (ALS), an n-channel MOSFET (NM) allocated to said at least one stage terminal (ALS) for connecting said at least one stage terminal to a reference potential in response to a trigger signal received at a gate terminal of said n-channel MOSFET (NM), a protecting circuit for protecting said at least one stage terminal against transient voltages, said protecting circuit comprising a first diode pair including a first Zener-diode (ZD1) and a first diode (D1) connected in series with each other between said at least one stage terminal (ALS) and said reference potential, wherein said first Zener-diode (ZD1) has an anode connected with said at least one stage terminal (ALS) and a cathode connected with a cathode of said first diode (D1), and wherein an anode of said first diode (D1) is connected to said reference potential, said protecting circuit further comprising a second diode pair including a second Zener-diode (ZD2) and a second diode (D2), wherein said second Zener-diode (ZD2) has an anode connected to said reference potential and a cathode connected to a tab of said n-channel MOSFET (NM) and wherein said second diode (D2) has a cathode also connected to said tab and an anode connected to said at least one stage terminal (ALS), said first and second diode pairs forming said protecting circuit for said at least one stage terminal (ALS).

2. The integrated circuit arrangement of claim 1, wherein said first and second Zener-diodes (ZD1, ZD2) have a breakdown voltage in the range of 30V to 50V.

3. The integrated circuit arrangement of claim 1, wherein said first and second diodes (D1, D2) have a breakdown voltage within the range of 50V to 60V.

4. The integrated circuit arrangement of claim 1, further comprising a receiver/transmitter circuit and a bus system connected to said receiver/transmitter circuit, said protecting circuit protecting said receiver/transmitter circuit against transient voltages.

5. The integrated circuit arrangement of claim 1, wherein said bus system is a CAN-bus.

6. The integrated circuit arrangement of claim 1, wherein said low-side driver stage and said protecting circuit against transient voltages form a single piece monolithic integrated structure or module.

7. An integrated circuit arrangement comprising a high-side driver stage (HS) including at least one stage terminal (AHS), a p-channel MOSFET (PM) allocated to said at least one stage terminal (AHS) for connecting said at least one stage terminal to a supply voltage (VA) in response to a trigger signal received at a gate terminal of said p-channel MOSFET (PM), a protecting circuit for protecting said at least one stage terminal (AHS) against transient voltages, said protecting circuit comprising a first diode pair including a first Zener-diode (ZD1') and a first diode (D1') connected in series with each other between said at least one stage terminal (AHS) and a reference potential, wherein said first Zener-diode (ZD1') has an anode connected with said at least one stage terminal (AHS) and a cathode connected with a cathode of said first diode (D1') and wherein an anode of said first diode (D1') is connected to said reference potential, and a second diode pair including a second Zener-diode (ZD3) and a second diode (D3), wherein said second Zener-diode (ZD3) has an anode connected to said reference potential and a cathode connected to a connector tab of said p-channel MOSFET (PM) and wherein said second diode (D3) has an anode connected to said supply voltage (VA) and a cathode connected to said connector tab of said p-channel MOSFET (PM), said first and second diode pairs forming said protecting circuit for said at least one stage terminal (AHS).

8. The integrated circuit arrangement of claim 7, wherein said first and second Zener-diodes (ZD1', ZD3) have a breakdown voltage in the range of 30V to 50V.

9. The integrated circuit arrangement of claim 7, wherein said first and second diodes (D1', D3) have a breakdown voltage within the range of 50V to 60V.

10. The integrated circuit arrangement of claim 7, further comprising a receiver/transmitter circuit and a bus system connected to said receiver/transmitter circuit, said protecting circuit protecting said receiver/transmitter circuit against transient voltages.

11. The integrated circuit arrangement of claim 10, wherein said bus system is a CAN-bus.

12. The integrated circuit arrangement of claim 7, wherein said high-side driver stage and said protecting circuit against transient voltages form a single piece monolithic integrated structure or module.

13. An integrated circuit arrangement for protecting at least one low side terminal (ALS) and at least one high side terminal of respective low side (LS) and high side (HS) driver stages against transient voltages, said circuit arrangement comprising a first section and a second section, said first section comprising an integrated circuit arrangement comprising a low-side driver stage (LS) including at least one stage terminal (ALS), an n-channel MOSFET (NM) allocated to said at least one stage terminal (ALS) for connecting said at least one stage terminal to a reference potential in response to a trigger signal received at a gate terminal of said n-channel MOSFET (NM), a protecting circuit for protecting said at least one stage terminal against transient voltages, said protecting circuit comprising a first diode pair including a first Zener-diode (ZD1) and a first diode (D1) connected in series with each other between said at least one stage terminal (ALS) and said reference potential, wherein said first Zener-diode (ZD1) has an anode connected with said at least one stage_terminal (ALS) and a cathode connected with a cathode of said first diode (D1), and wherein an anode of said first diode (D1) is connected to said reference potential, said protecting circuit further comprising a second diode pair including a second Zener-diode (ZD2) and a second diode (D2), wherein said second Zener-diode (ZD2) has an anode connected to said reference potential and a cathode connected to a tab of said n-channel MOSFET (NM) and wherein said second diode (D2) has a cathode also connected to said tab and an anode connected to said at least one stage terminal (ALS), said first and second diode pairs forming said protecting circuit for said at least one stage terminal (ALS); said second section comprising an integrated circuit arrangement comprising a high-side driver stage (HS) including at least one stage terminal (AHS), a p-channel MOSFET (PM) allocated to said at least one stage terminal (AHS) for connecting said at least one stage terminal to a supply voltage (VA) in response to a trigger signal received at a gate terminal of said p-channel MOSFET (PM), a protecting circuit for protecting said at least one stage terminal (AHS) against transient voltages, said protecting circuit comprising a first diode pair including a first Zener-diode (ZD1') and a first diode (D1') connected in series with each other between said at least one stage terminal (AHS) and a reference potential, wherein said first Zener-diode (ZD1') has an anode connected with said at least one stage terminal (AHS) and a cathode connected with a cathode of said first diode (D1') and wherein an anode of said first diode (D1') is connected to said reference potential, and a second diode pair including a second Zener-diode (ZD3) and a second diode (D3), wherein said second Zener-diode (ZD3) has an anode connected to said reference potential and a cathode connected to a connector tab of said p-channel MOSFET (PM) and wherein said second diode (D3) has an anode connected to said supply voltage (VA) and a cathode connected to said connector tab of said p-channel MOSFET (PM), said first and second diode pairs forming said protecting circuit for said at least one stage terminal (AHS).

* * * * *

UNITED STATES PATENT AND TRADEMARK OFFICE
CERTIFICATE OF CORRECTION

PATENT NO. : 7,130,175 B2  
APPLICATION NO. : 10/900643  
DATED : October 31, 2006  
INVENTOR(S) : Dietz et al.

Page 1 of 1

It is certified that error appears in the above-identified patent and that said Letters Patent is hereby corrected as shown below:

<u>Column 7,</u>
Line 23, after "claim", replace "1" by --4--.

Signed and Sealed this

Fifteenth Day of May, 2007

JON W. DUDAS  
*Director of the United States Patent and Trademark Office*